United States Patent
Urban et al.

(10) Patent No.: US 6,886,432 B2
(45) Date of Patent: May 3, 2005

(54) APPARATUS FOR ACCESSING TELECOMMUNICATIONS NETWORKS

(75) Inventors: Blake R. Urban, Hickory, NC (US); Isaac D. M. White, Groveland, FL (US); James E. Dickens, Ocoee, FL (US); Kevin Forsberg, Orlando, FL (US); Charles Sawyer, Orlando, FL (US)

(73) Assignee: BellSouth Intellectual Property Corporation, Wilmington, DE (US)

( * ) Notice: Subject to any disclaimer, the term of this patent is extended or adjusted under 35 U.S.C. 154(b) by 75 days.

(21) Appl. No.: 10/434,858

(22) Filed: May 9, 2003

(65) Prior Publication Data
US 2004/0222781 A1 Nov. 11, 2004

(51) Int. Cl.[7] .................................................. B25F 1/00
(52) U.S. Cl. ........................... 81/437; 81/439; 81/63.1; 7/138; 324/72.5; 324/95
(58) Field of Search ............................... 324/72.5, 207, 324/326–329, 426, 427, 166, 207.2, 207.25; 81/437, 439, 960, 177.85, 125.1

(56) References Cited

U.S. PATENT DOCUMENTS

| | | | |
|---|---|---|---|
| 3,337,801 A | 8/1967 | Rinier | |
| 3,828,256 A | 8/1974 | Liu | |
| 4,724,382 A | 2/1988 | Schauerte | |
| 4,736,480 A | 4/1988 | Bohl | |
| 5,369,363 A | 11/1994 | Hey | |
| 5,685,761 A | 11/1997 | Schepens | |
| 6,100,679 A | 8/2000 | McCasland | |
| 6,157,184 A | 12/2000 | Atherton | |
| 6,259,243 B1 | 7/2001 | Lundquist | |
| 6,286,397 B1 * | 9/2001 | Taggart et al. | ................ 81/63.1 |
| 6,705,183 B1 * | 3/2004 | Dickens | ........................ 81/437 |

* cited by examiner

Primary Examiner—David Zarneke
Assistant Examiner—Jimmy Nguyen
(74) Attorney, Agent, or Firm—Walters & Zimmerman; Gaoff Suldiffe; Todd Michem (57) ABSTRACT

An apparatus is disclosed for accessing a Network Interface Device of a telecommunications network. The apparatus has a main body having a first end, a second end, and an interior cavity. The interior cavity is open at the first end and extends into an interior region of the main body. The interior cavity is bound by a side wall and terminates within the main body at an end wall. The second end of the main body has at least one of a square drive, a socket, and a screwdriver bit, with the square drive for attaching conventional sockets, extensions, and other tools. The second end of the main body thus allows for engagement with various types and sizes of fasteners.

17 Claims, 9 Drawing Sheets

APPARATUS FOR ACCESSING TELECOMMUNICATIONS NETWORKS

CROSS-REFERENCE TO RELATED APPLICATIONS

This patent application relates to the commonly-assigned and co-pending U.S. application Ser. No. 10/326,688, filed Dec. 20, 2002 and entitled "Apparatus for Accessing Telecommunications Networks," of which the "Brief Summary of the Invention" and "Detailed Description of the Invention" sections are incorporated herein by reference.

NOTICE OF COPYRIGHT PROTECTION

A portion of the disclosure of this patent document and its figures contain material subject to copyright protection. The copyright owner has no objection to the facsimile reproduction by anyone of the patent document or the patent disclosure, but the copyright owner otherwise reserves all copyrights whatsoever.

BACKGROUND OF THE INVENTION

1. Field of the Invention

This invention generally relates to hand tools and to electrical communications and, more particularly, to electric field detectors.

2. Description of the Related Art

High-voltages may be lethal when contacted. Electrical transmission lines transmit high voltages. If a person contacts an electrical transmission line, the person could be subjected to a lethal voltage. Telecommunications technicians, cable technicians, construction crews, and other persons are frequently in the vicinity of high voltage power lines, regional power stations, and local substations. These people must take precautions to avoid lethal contact with high voltages.

These persons, then, often use a high-voltage detector. A voltage detector senses an electrical field in the vicinity of the person or in the vicinity of a work area. These voltage detectors warn the person of dangerous, high-voltages in the vicinity. These voltage detectors typically provide an audible and/or visual warning of the dangers voltage. These previous voltage detectors, however, have limited utility. The prior art voltage detectors only sense voltages. Technicians must often carry several pieces of equipment that perform several functions. While the voltage detector is important, life-saving equipment, sometimes a technician cannot carry all the necessary equipment. If the voltage detector could perform multiple functions, the utility of the voltage detector would be improved. There is, accordingly, a need for an improved voltage detector that performs multiple functions.

BRIEF SUMMARY OF THE INVENTION

The aforementioned problems, and other problems, are reduced by an apparatus for accessing terminals and Network Interface Devices of a telecommunications network. This invention is a sleeve that slides over the outer housing of a voltage detector. The sleeve includes various tools that increase the utility of the voltage detector. The technician, or other user, slides this invention onto the voltage detector. The technician uses the voltage detector to ensure no dangerous electric fields are present within the terminal and/or the Network Interface Device. Once the terminal and/or the Network Interface Device is safe from dangerous voltage, the technician then uses the various tools to open the terminal and/or the Network Interface Device. This invention, then, improves the utility of the voltage detector by allowing the voltage detector to perform multiple functions. This invention also quickly and safely allows the technician to check for dangerous voltages before accessing the terminal and/or the Network Interface Device.

One embodiment of this invention describes an apparatus for accessing a Network Interface Device of a telecommunications network. The apparatus has a main body having a first end, a second end, and an interior cavity. The interior cavity is open at the first end and extends into an interior region of the main body. The interior cavity is bound by a side wall and terminates within the main body at an end wall. The second end of the main body comprises at least one of a square drive, a socket, and a screwdriver bit, with the square drive for attaching conventional sockets, extensions, and other tools. The second end of the main body allows for engagement with various types and sizes of fasteners.

Another embodiment of this invention also describes an apparatus for accessing a Network Interface Device of a telecommunications network. This embodiment has a main body having a first end, a second end, and an interior cavity. The interior cavity is open at the first end and extends into an interior region of the main body. The interior cavity is bound by a side wall and terminates within the main body at an end wall. A revolver extends from the second end of the main body, and the revolver has a center portion rotating about a pivot. The revolver comprises at least one of a socket, a 216-Type can wrench, a security wrench, and a screwdriver bit. The socket, can wrench, security wrench, and screwdriver bit each extend from the center portion of the revolver such that the revolver may be rotated for engagement with a fastener.

Yet another embodiment of this invention describes an apparatus for sensing electromagnetic fields. The apparatus has an electromagnetic sensor disposed in a housing, and the electromagnetic sensor senses an electromagnetic field. A sleeve is adapted to slide onto the housing, and the sleeve comprises a main body having a first end, a second end, and an interior cavity. The interior cavity is open at the first end and extends into an interior region of the main body. The interior cavity is bound by a side wall and terminates within the main body at an end wall, the interior cavity being adapted to slide onto the housing. The second end of the main body has a revolver, and the revolver rotates about a pivot. The revolver comprises at least one of a socket and a screwdriver bit such that the revolver may be rotated for engagement with a fastener.

BRIEF DESCRIPTION OF THE SEVERAL VIEWS OF THE DRAWINGS

These and other features, aspects, and advantages of this invention are better understood when the following Detailed Description of the Invention is read with reference to the accompanying drawings, wherein.

DETAILED DESCRIPTION OF THE INVENTION

Figure 1:
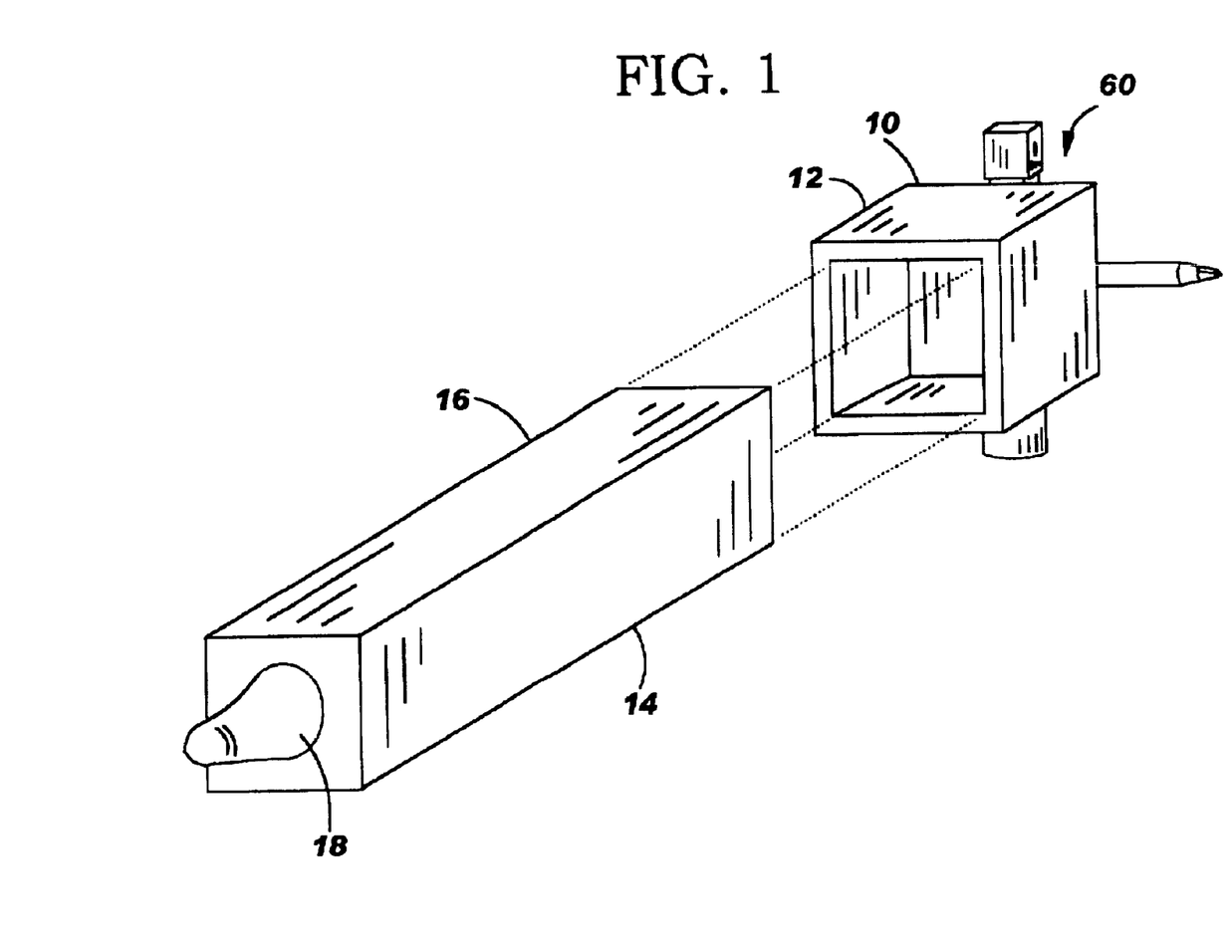
FIG. 1 is a schematic illustrating an apparatus according to this invention.

FIG. 1 is a schematic illustrating an apparatus 10 according to this invention. The apparatus 10 resembles a sleeve 12 adapted to slide onto a housing 14 of an electromagnetic detector 16. The electromagnetic detector 16 comprises an electromagnetic sensor 18 disposed in the housing 14. The electromagnetic sensor 18 senses an electromagnetic field in the vicinity of the sensor 18. The sleeve 12 comprises various tools 60 that increase the utility of the electromagnetic detector 16. Once the electromagnetic detector 16 detects no dangerous electromagnetic fields are present in the work area, a user may "flip" the electromagnetic detector 16 and use the tools 60 to remove threaded bolts, screws, and other fasteners. The sleeve 12 slides onto the electromagnetic detector 16 and, thus, transforms the electromagnetic detector 16 into a multipurpose tool.

Figure 2:
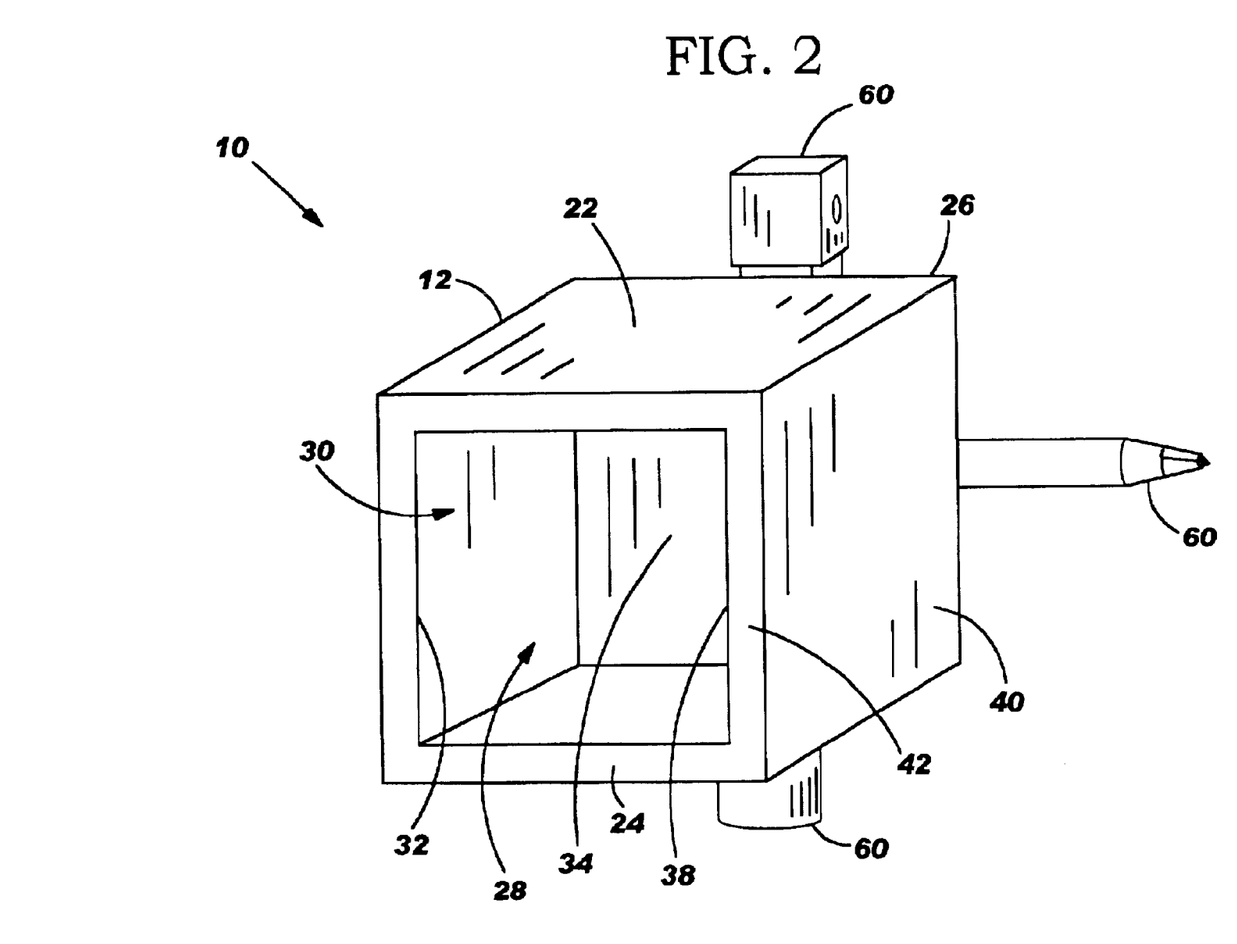
FIG. 2 is a front isometric view of the apparatus shown in FIG. 1.

FIG. 2 is a front isometric view of the apparatus 10 shown in FIG. 1. The sleeve 12 comprises a main body 22. The main body 22 has a first end 24, a second end 26, and an interior cavity 28. The interior cavity 28 is open at the first end 24 and extends into an interior region 30 of the main body 22. The interior cavity 28 is bound by a side wall 32 and terminates within the main body 22 at an end wall 34. The side wall 32 is shown as having a rectangular shape, thus defining a rectangularly-shaped cross-section 38 of the interior cavity 28. An outer surface 40 of the main body 22 extends from the first end 24 to the second end 26, and the outer surface 40 has a rectangular cross-section 42. While the interior cavity 28 is shown with the rectangularly-shaped cross-section 38, the interior cavity may have any desired cross-sectional shape that slides over and onto the electromagnetic detector 16. Although the outer surface 40 of the main body 22 is also shown with a rectangular cross-section 42, the outer surface 40, likewise, may have any desired cross-sectional shape.

Figure 3:
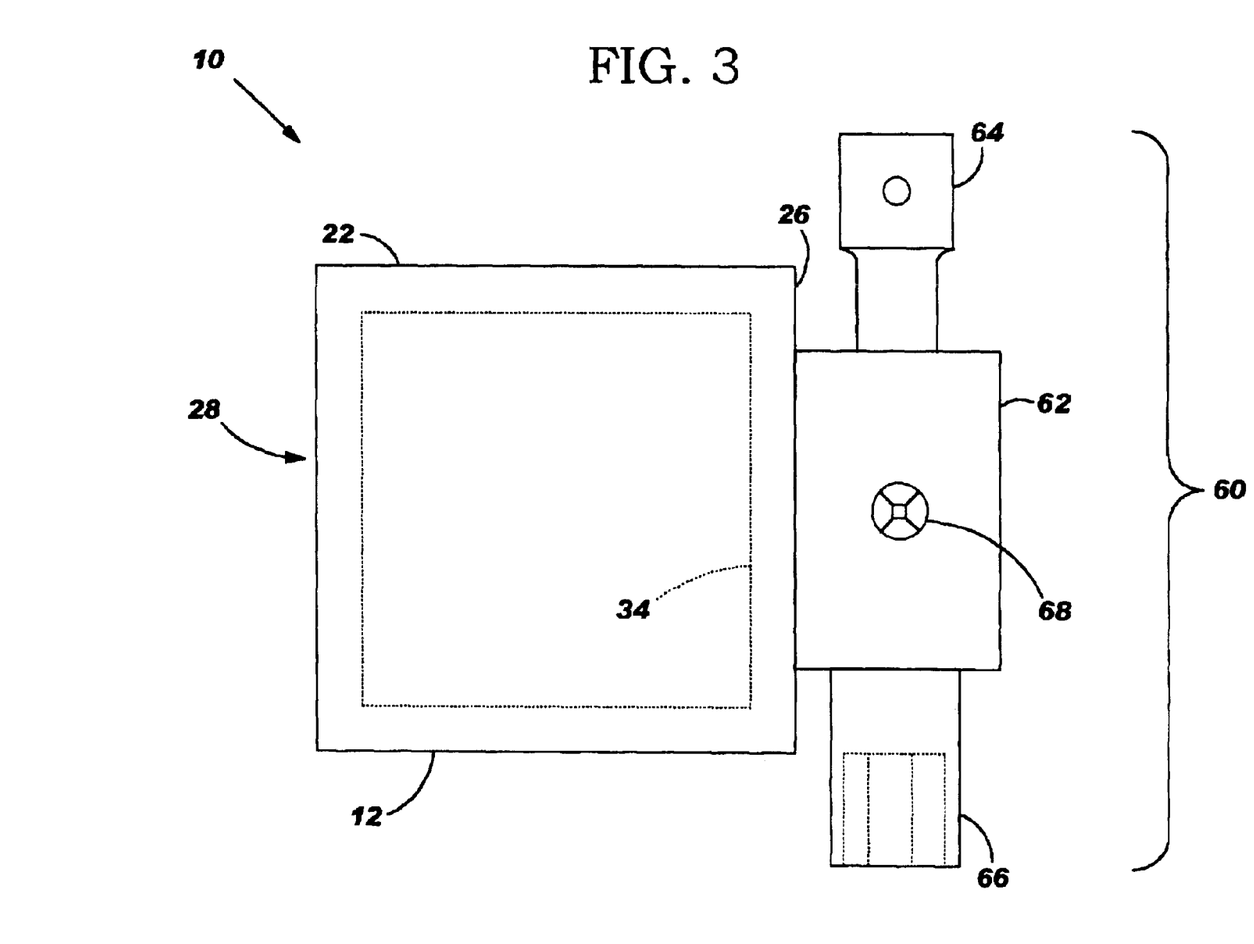
FIGS. 3–5 are additional schematics illustrating the apparatus shown in FIGS. 1 and 2.
Figure 4:
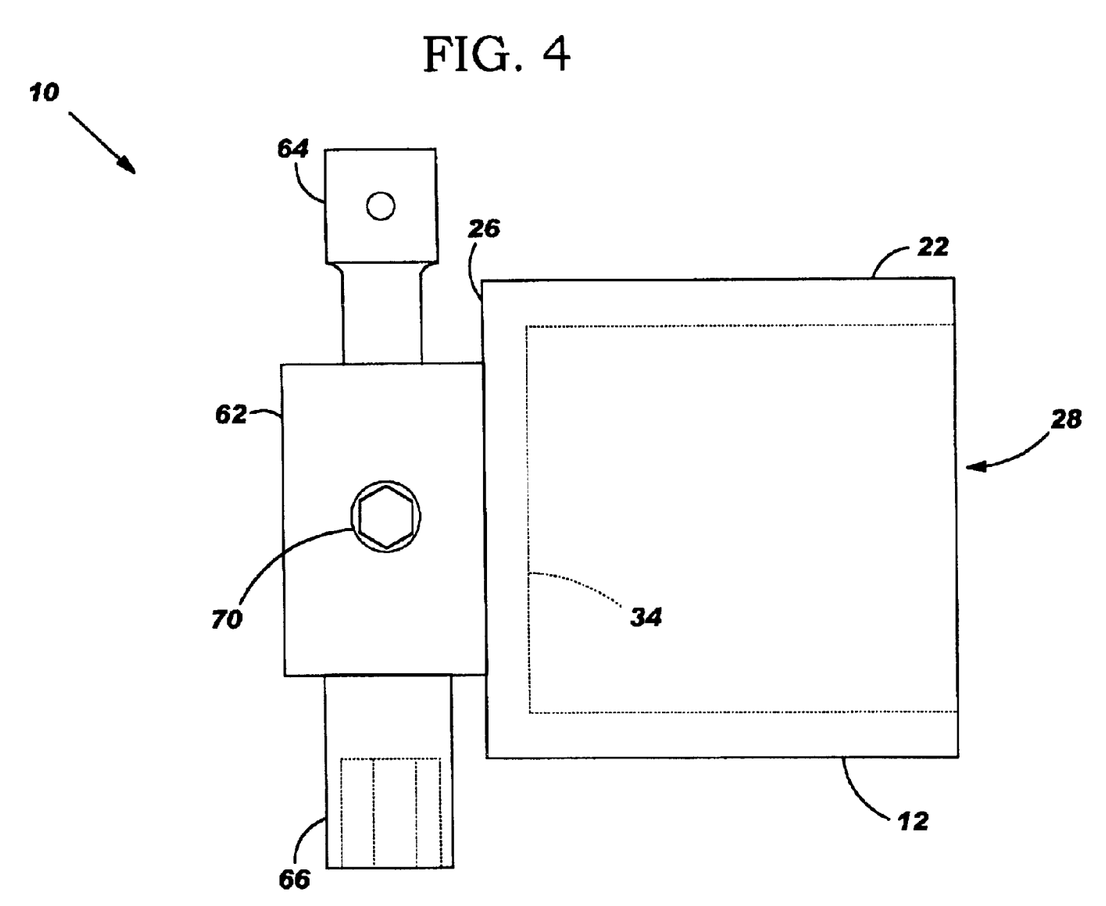
Figure 5:
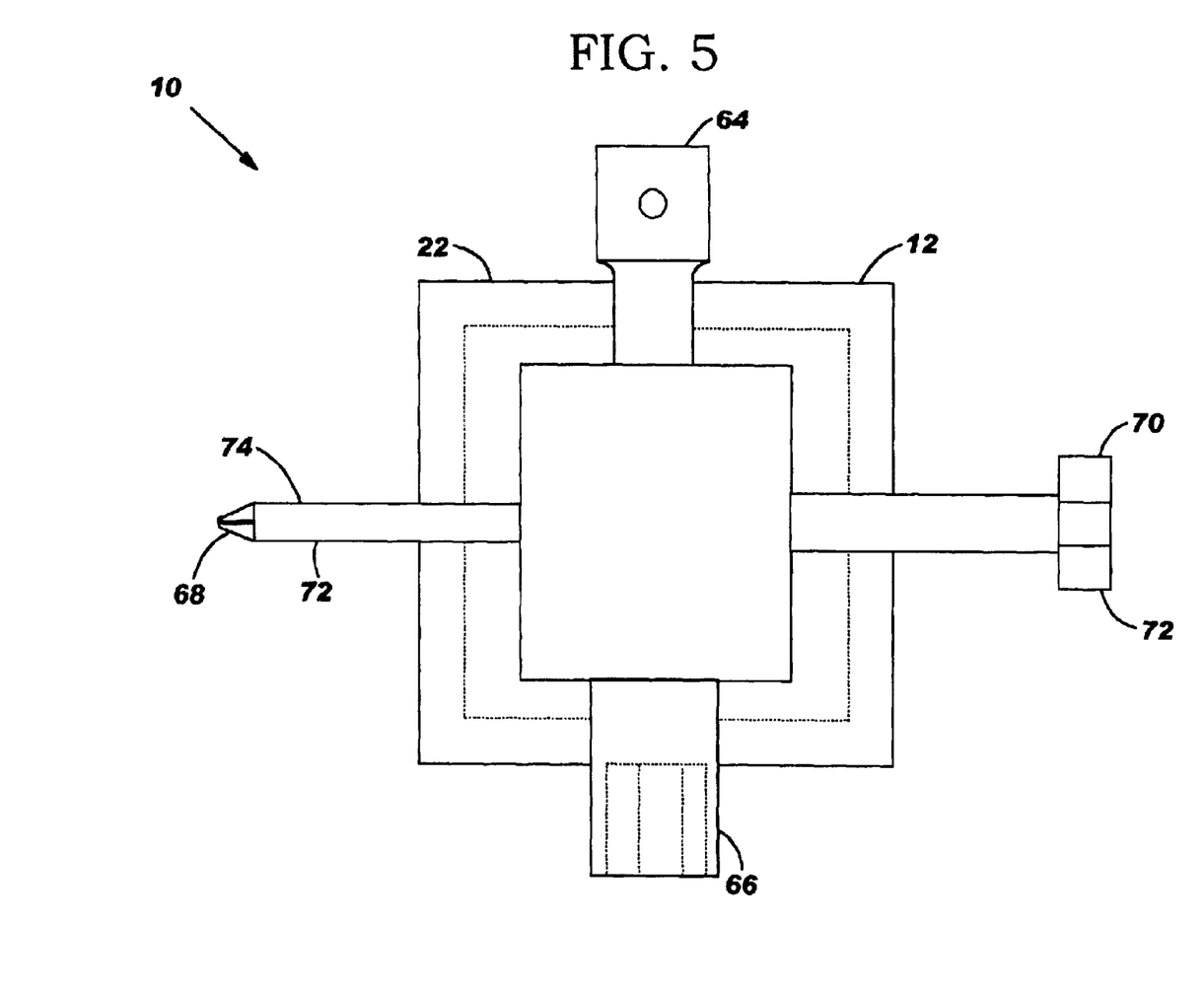

FIGS. 3–5 are additional schematics illustrating the apparatus 10 shown in FIGS. 1 and 2. FIGS. 3 and 4 are, respectively, left side and right side orthographic views, while FIG. 5 is a rear orthographic view. Here the second end 26 of the main body 22 comprises various tools 60 that allow the sleeve 12 to engage various types and sizes of fasteners. The second end 26 of the main body 22 has a center portion 62. The center portion 62 extends from the second end 26, and the various tools 60 outwardly extend from the center portion 62. FIGS. 3 and 5 show a male-ended square drive 64, a socket 66, and a screwdriver bit 68 outwardly extending from the center portion 62. FIGS. 4 and 5 also show the male square drive 64 and the socket 66 outwardly extending from the center portion 62. FIGS. 4 and 5, however, also show a security wrench 70 outwardly extending from the center portion 62. When the sleeve 12 is slid over the outer housing of the electromagnetic detector (shown, respectively, as reference numerals 12 and 16 in FIG. 1), the technician uses the various tools 60 to engage various sizes and types of fasteners. The sleeve 12, then, improves the utility of the electromagnetic detector by allowing the detector to perform multiple functions.

The male square drive 64 accepts conventional sockets, extensions, and other tools. As those of ordinary skill in the art recognize, the square drive 64 permits the attachment of conventional sockets, extensions, and other tools. While the square drive 64 may have any size, the square drive 64 preferably conforms to the sizing for a conventional a ¼-inch square drive, a ⅜-inch square drive, or a ½-inch square drive.

The socket 66 may accept conventional and/or specialty polygonal-head fasteners. The socket 66, for example, may be a conventional ³⁄₁₆-inch or ⁵⁄₁₆-inch 6-point, 8-point, or 12-point socket. The socket 66 may have other nominal diameters, yet ³⁄₁₆-inch and ⁵⁄₁₆-inch diameters are commonly required for repair of telecommunications networks. The socket 66, however, is preferably a thin-walled 216-Type "can wrench" that permits access to Network Interface Devices in a telecommunications network. The 216-Type can wrench is a hex-head socket with a reduced outside diameter. The 216-Type can wrench has either a ⅜-inch inside nominal diameter or a ⁷⁄₁₆-inch inside nominal diameter. Although the apparatus 10 of this invention is heretofore unavailable, can wrenches are commercially available (see, e.g., tool No. F003200 and tool No. F003205 available from Marconi plc, 1000 Marconi Drive, Warrendale, Pa. 15086-7502, 1-866-627-2664, www.marconi.com, and tool No. 19195 available from Stanley-Proto Industrial Tools, 14117 Industrial Park Blvd. NE, Covington, Ga. 30014 USA, 770-787-3800, www.stanleyproto.com).

The screwdriver bit 68 may also engage any conventional and/or specialty fastener. The screwdriver bit 68 is preferably a conventional flathead blade or a Phillips-head design. FIG. 5 shows an elongate screwdriver shank 70 outwardly extends from the center portion 62. An outer end 72 of the shank 70 has the screwdriver bit 68. The screwdriver shank 70 may be removed from the center portion 62, thus allowing various screwdriver bits to be interchanged. The screwdriver bit 68 may also comprise other drive bits, such as TORX®, square, hex, SNAKE EYES® spanner, and pin head (TORX® is a registered trademark of the Camcar Corp. division of Textron Industries, and SNAKE EYES® is a registered trademark of the Tamper Proof Screw Co., Inc.).

The security wrench 70 is for engaging a fastener at a demarcation point of a telecommunications network. As those of ordinary skill in the art recognize, the security wrench 70 is used to open and close a Network Interface Device (not shown) of a telecommunications network. The Network Interface Device typically represents a demarcation point within the telecommunications network. The Network Interface Device separates the telecommunications service provider's responsibilities from the customer's inside wiring. The security wrench 70 engages a specialty fastener in the Network Interface Device. This specialty fastener helps prevent the customer from tampering with wires and connections that are the responsibility of the service provider. The specialty fastener resembles an ordinary Allen hex-head screw; however, this specialty fastener has a center post in the hex-head. An Allen head key/wrench, therefore, cannot be inserted into the head of the specialty fastener. The security wrench 70, then, is a thin-walled socket with a hexagonally-shaped exterior 72. The security wrench 70 engages the specialty fastener in the Network Interface Device. The security wrench 70 could have a smoothly bored interior cross section to accept the center post in the head of the specialty fastener. The security wrench 70 may also have a polygonally-shaped interior cross section to accept the center post in the head of the specialty fastener.

Figures 6, 7:
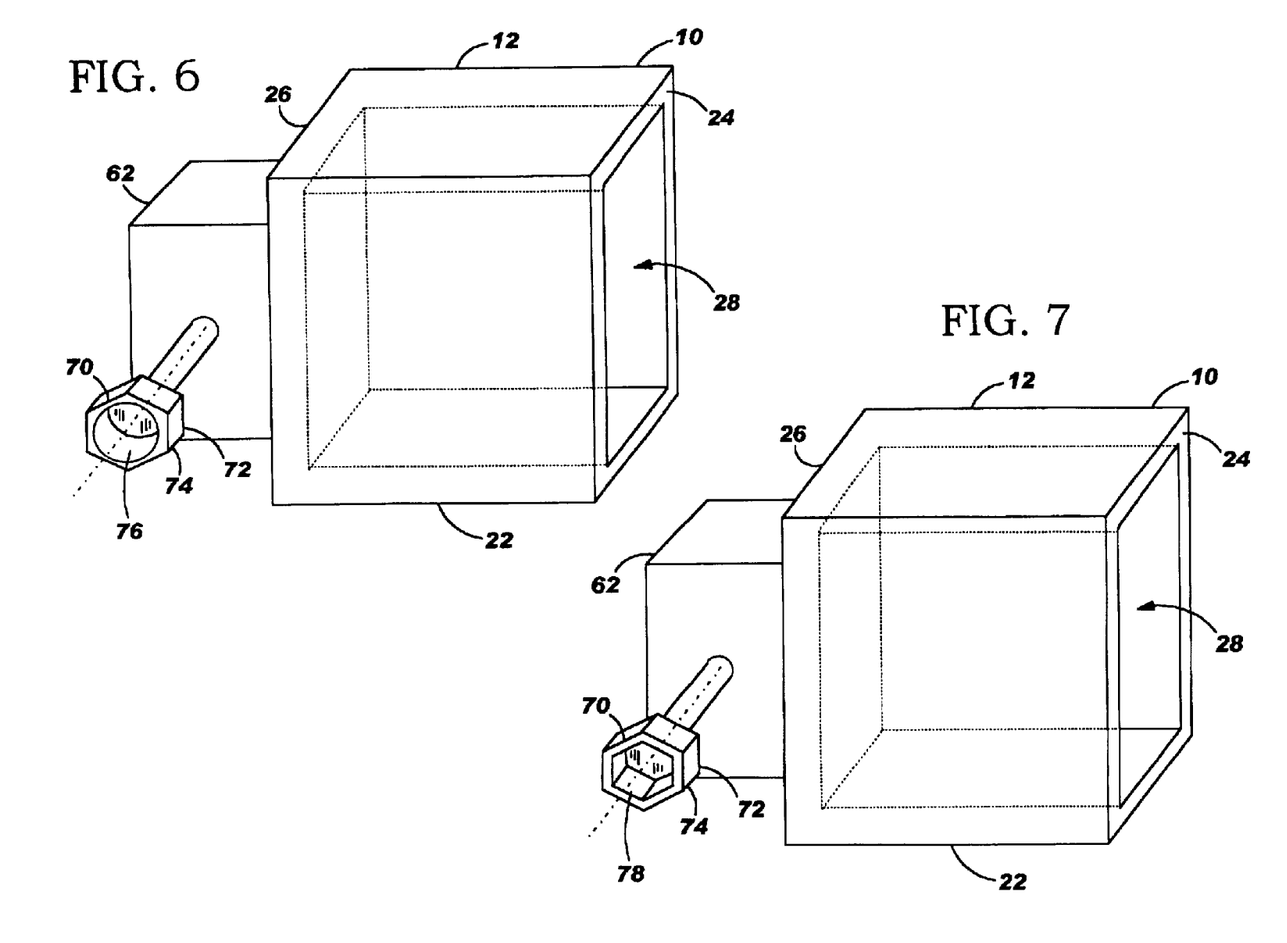
FIGS. 6 and 7 are schematics showing some details of the security wrench shown in FIG. 5.

FIGS. 6 and 7 are schematics showing some details of the security wrench 70 shown in FIG. 5. The security wrench 70 is a thin-walled socket 74. The security wrench 70, however, has the hexagonally-shaped exterior 72. FIG. 6 illustrates the security wrench 70 could have a smoothly bored interior cross section 76. This smooth-bored interior cross section 76 accepts the center post in the head of the specialty fastener. FIG. 7, however, illustrates the security wrench 70 may also have a polygonally-shaped interior cross section 78 to accept the center post in the head of the specialty fastener.

Figure 8:
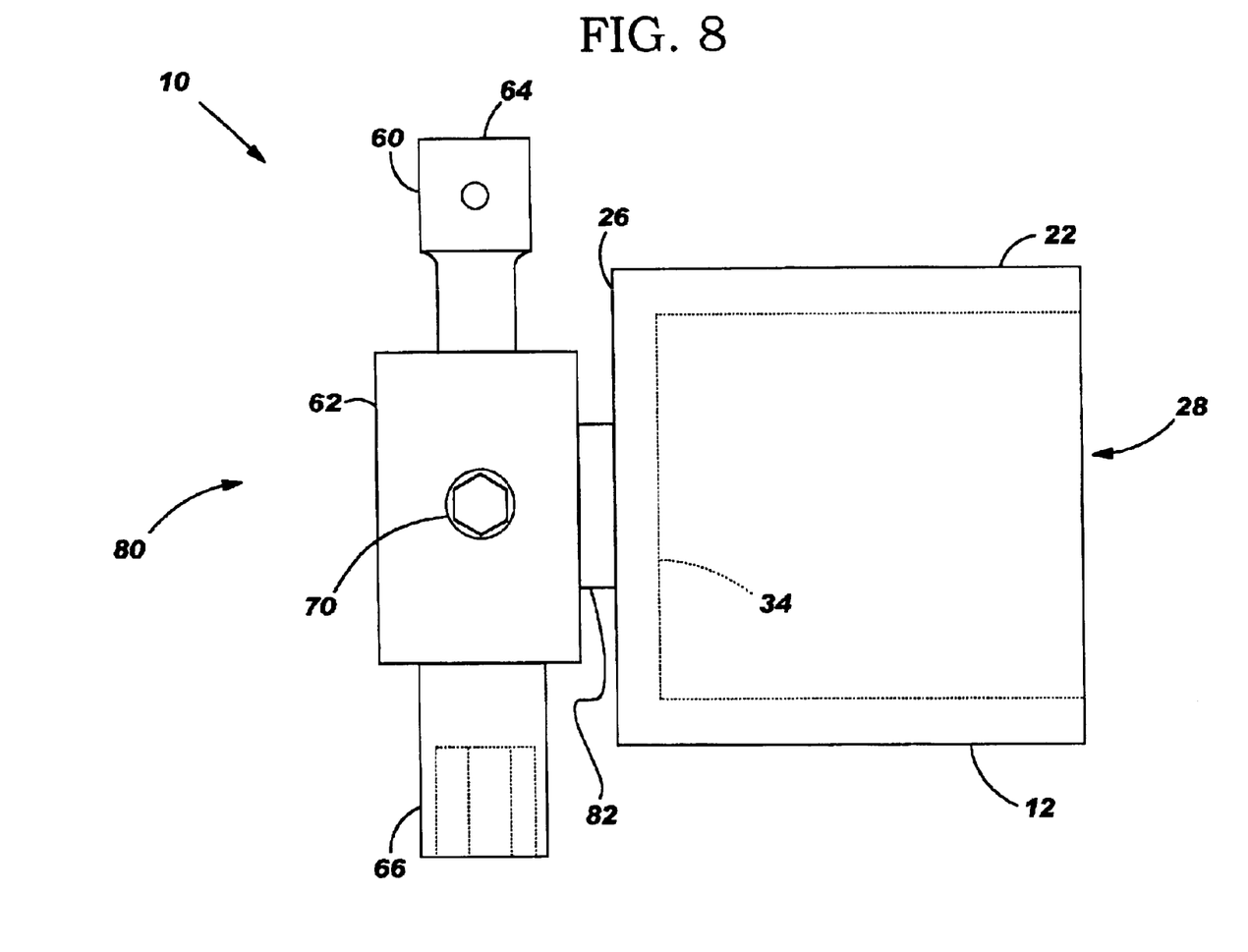
FIGS. 8 and 9 are schematics illustrating another embodiment of this invention.
Figure 9:
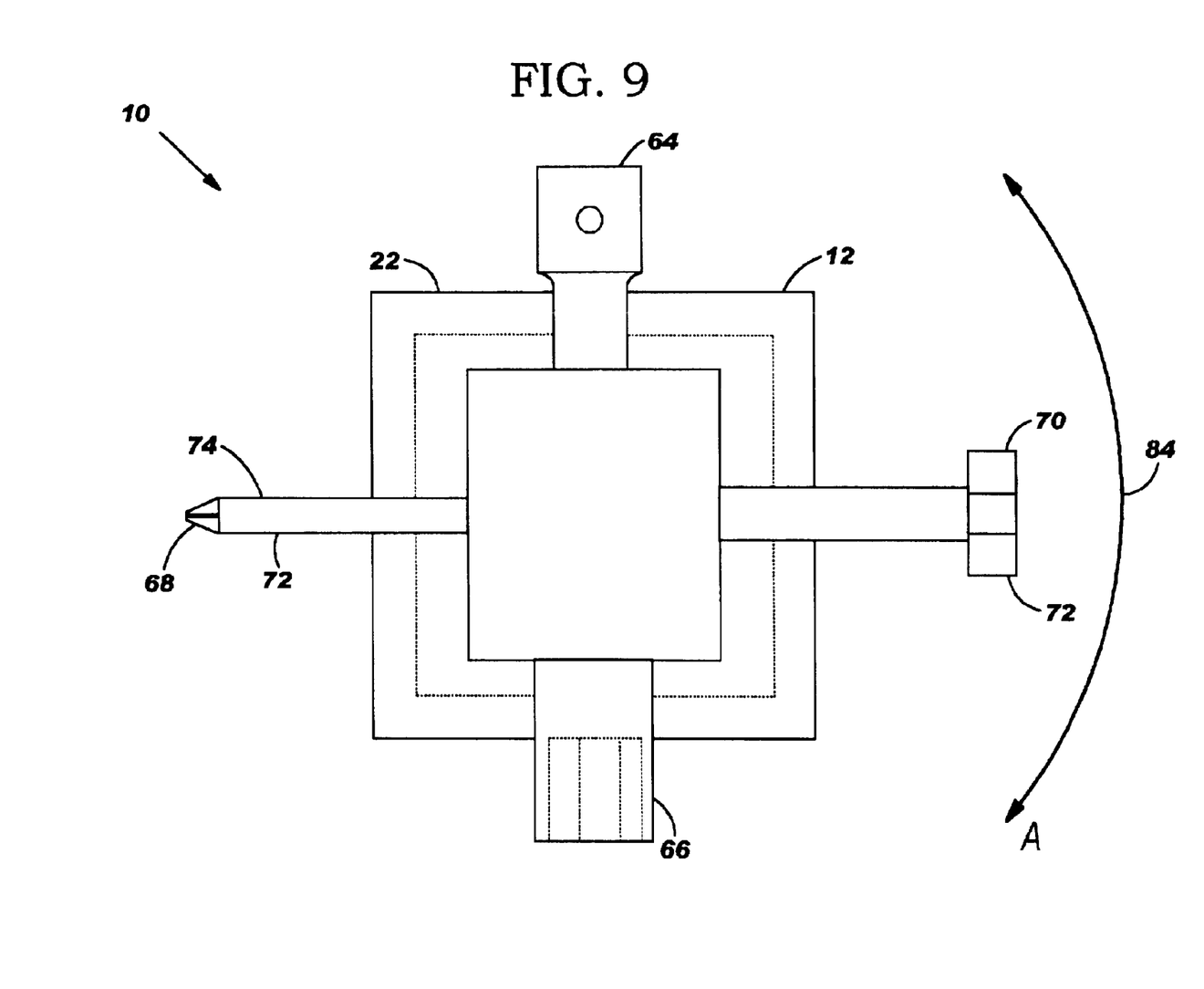

FIGS. 8 and 9 are schematics illustrating another embodiment of this invention. Here the apparatus 10 comprises a revolver 80. The revolver 80 is pivotally mounted to the main body 22, and the revolver 80 comprises at least one of the tools 60 (e.g., the square drive 64, the 216-Type can wrench 66, the security wrench 70, and the screwdriver bit 68). Each tool 60 extends from the center portion 62 of the revolver 80, and the center portion 62 rotates about a pivot 82. Because the revolver 80 is pivotally mounted to the main body 22, the revolver 80 may be rotated with respect to the main body 22. As FIG. 9 shows, the revolver 80 may be rotated in either a clockwise or counterclockwise direction as illustrated by arc "A" (shown as reference numeral 84). The revolver 80, and thus the tools 60, may be rotated for engagement with various types and sizes of fasteners. The apparatus 10 may further comprise a ratcheting mechanism that indexes the revolver 80 as it pivots to the main body 22. The apparatus may also further comprise one or more detents, pawls, or other components that retain, stop, or lock the revolver 80.

Figure 10:
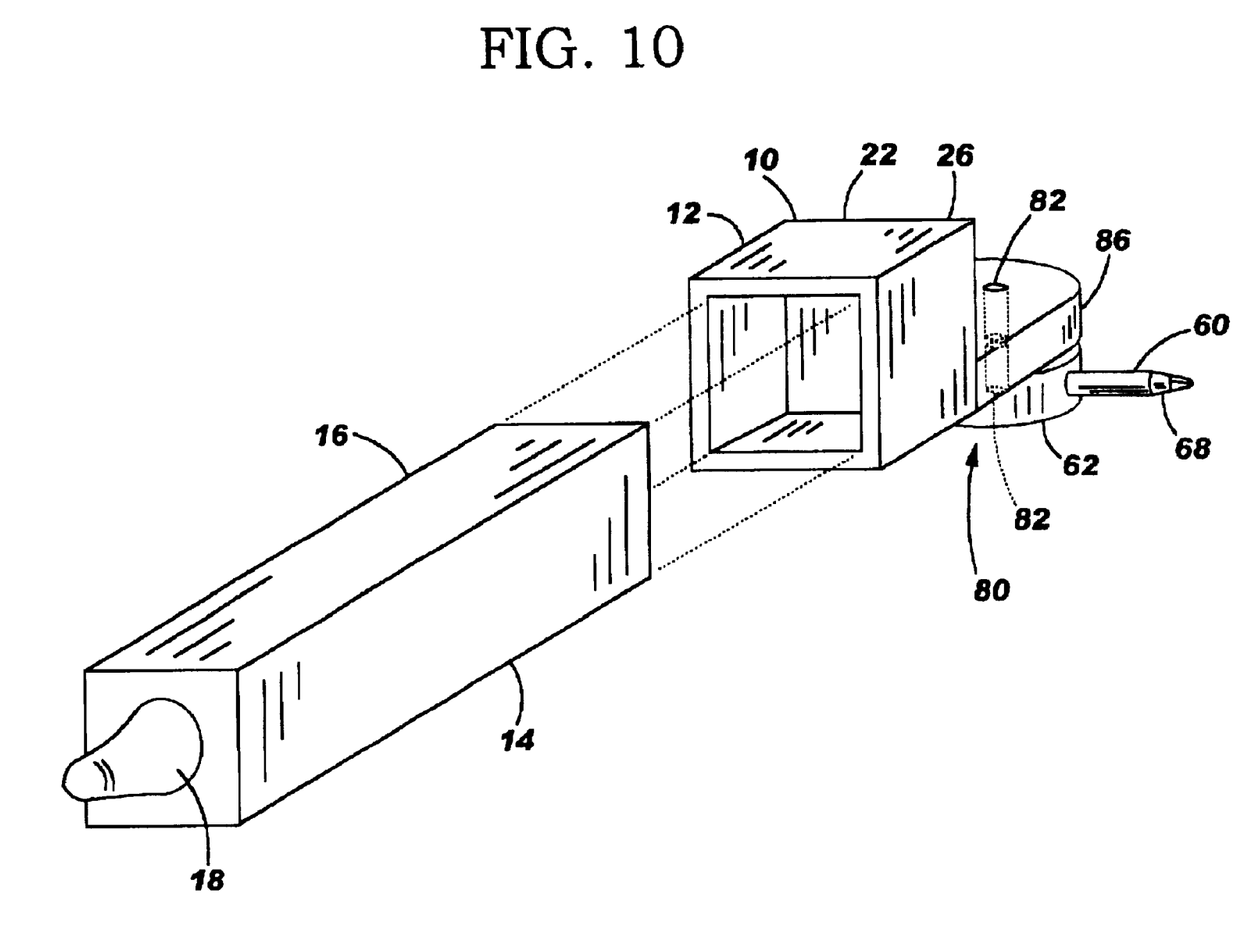
FIG. 10 is a schematic illustrating yet another embodiment of this invention.

FIG. 10 is a schematic illustrating yet another embodiment of this invention. FIG. 10 is similar to FIG. 1, yet here the revolver 80 outwardly extends from second end 26 of the main body 22. As FIG. 10 shows, an extension arm 86 outwardly extends from the second end 26 of the main body 22. The revolver 80 is pivotally mounted to the extension arm 86, and the revolver 80 comprises at least one of the tools 60, such as the screwdriver bit 68 shown (and/or the square drive 64, the 216-Type can wrench 66, and the security wrench 70). Each tool 60 extends from the center portion 62 of the revolver 80, and the center portion 62 rotates about the pivot 82. Because the revolver 80 is pivotally mounted to the main body 22, the revolver 80 may be rotated with respect to the main body 22. Because the revolver 80 may be rotated in either a clockwise or counterclockwise direction, the revolver 80, and thus the tools 60, may be rotated for engagement with various types and sizes of fasteners.

The apparatus 10 lends itself to various modifications and manufacturing processes. While the interior cavity 28 is shown with the rectangularly-shaped cross-section 38, the interior cavity may have any desired cross-sectional shape that slides over and onto the electromagnetic detector 16. Although the outer surface 40 of the main body 22 is also shown with a rectangular cross-section 42, the outer surface 40, likewise, may have any desired cross-sectional shape. Although FIGS. 3–10 show the center portion 62 having a rectangular and/or cubic shape, the center portion 62, too, may have any shape that suits a particular design requirement. The apparatus 10 is preferably molded of a insulative plastic/polymer material, yet the apparatus 10 may also be machined from metal material(s), composite materials, wood, or other rigid material.

This invention is also applicable to more devices than electromagnetic field detectors. The interior cavity (shown as reference numeral 28) is shown having a rectangularly-shaped cross-section (shown as reference numeral 38 in FIG. 2). This rectangular cross-section is adapted to slide onto the rectangularly-shaped housing (shown as reference numeral 14 in FIG. 1) of the electromagnetic field detector. The interior cavity, however, may have any desired cross-sectional shape that slides over and onto the housing. The interior cavity, in fact, may have any desired cross-sectional shape that slides onto any tool or equipment. While this invention is discussed with reference to electromagnetic field detectors (e.g., "voltage detectors"), this invention is equally applicable to all electrical and voice/data/video testing equipment. The interior cavity may have cross-sectional shape that slides onto any equipment.

While the present invention has been described with respect to various features, aspects, and embodiments, those skilled and unskilled in the art will recognize the invention is not so limited. Other variations, modifications, and alternative embodiments may be made without departing from the spirit and scope of the present invention.

What is claimed is:

1. An apparatus, comprising:
    a main body having a first end, a second end, and an interior cavity, the interior cavity open at the first end and extending into an interior region of the main body, the interior cavity bound by a side wall and terminating within the main body at an end wall; and
    the second end of the main body comprising at least one of a male-ended square drive, a socket, and a screwdriver bit, the male-ended square drive for attaching conventional sockets, extensions, and other tools, the second end of the main body for engaging various types and sizes of fasteners.

2. An apparatus according to claim 1, wherein the socket comprises a 216-Type can wrench.

3. An apparatus according to claim 1, wherein the socket comprises a security wrench having at least one of i) a hexagonally-shaped exterior surface for accessing a fastener, ii) a smoothly bored interior cross section for accessing the fastener, and iii) a polygonally-shaped interior cross section for accessing the fastener.

4. An apparatus according to claim 1, wherein the male-ended square drive, socket, and screwdriver bit extend from a revolver, the revolver pivotally mounted to the main body such that the revolver may be rotated.

5. An apparatus according to claim 1, wherein the male-ended square drive comprises at least one of i) a ¼-inch square drive, ii) a ⅜-inch square drive, and ii) a ½-inch square drive.

6. An apparatus according to claim 1, wherein the side wall has a rectangular shape, thus defining a rectangularly-shaped cross-section of the interior cavity.

7. An apparatus according to claim 1, wherein the main body comprises an outer surface extending from the first end to the second end, the outer surface having a rectangular cross-section.

8. An apparatus, comprising:
    a main body having a first end, a second end, and an interior cavity, the interior cavity open at the first end and extending into an interior region of the main body, the interior cavity bound by a side wall and terminating within the main body at an end wall; and
    a revolver pivotally mounted to the main body, the revolver comprising at least one of
    a male-ended square drive,
    a 216-Type can wrench,
    a security wrench, and
    a screwdriver bit,
    each extending from a center portion of the revolver such that the revolver may be rotated for engagement with a fastener.

9. An apparatus according to claim 8, wherein the 216-Type can wrench comprises at least one of i) a polygonally-shaped interior cross-section having a nominal diameter of ⅜-inch and ii) a polygonally-shaped interior cross-section having a nominal diameter of ⁷⁄₁₆-inch.

10. An apparatus according to claim 8, wherein the security wrench comprises at least one of i) a hexagonally-shaped exterior surface for accessing the fastener, ii) a smoothly bored interior cross section for accessing the fastener, and iii) a polygonally-shaped interior cross section for accessing the fastener.

11. An apparatus according to claim 8, wherein the male-ended square drive comprises at least one of i) a ¼-inch square drive, ii) a ⅜-inch square drive, and ii) a ½-inch square drive.

12. An apparatus, comprising:
   an electromagnetic sensor disposed in a housing, the electromagnetic sensor sensing an electromagnetic field;
   a sleeve adapted to slide onto the housing, the sleeve comprising a main body having a first end, a second end, and an interior cavity, the interior cavity open at the first end and extending into an interior region of the main body, the interior cavity bound by a side wall and terminating within the main body at an end wall, the interior cavity adapted to slide onto the housing; and
   the second end of the main body comprising at least one of a male-ended square drive, a socket, and a screwdriver bit, the male-ended square drive for attaching conventional sockets, extensions, and other tools, the second end of the main body for engaging various types and sizes of fasteners.

13. An apparatus according to claim 12, wherein the socket comprises a 216-Type can wrench having at least one of i) a polygonally-shaped interior cross-section having a nominal diameter of ⅜-inch and ii) a polygonally-shaped interior cross-section having a nominal diameter of 7/16-inch.

14. An apparatus according to claim 12, wherein the socket comprises a security wrench having at least one of i) a hexagonally-shaped exterior surface for accessing a fastener, ii) a smoothly bored interior cross section for accessing the fastener, and iii) a polygonally-shaped interior cross section for accessing the fastener.

15. An apparatus according to claim 12, wherein the socket comprises at least one of i) a polygonally-shaped interior cross-section having a nominal diameter of 5/16-inch and ii) a polygonally-shaped interior cross-section having a nominal diameter of 3/16-inch.

16. An apparatus according to claim 12, wherein the housing has an outer surface, and the outer surface has a rectangular cross-section and the side wall of the sleeve having a rectangular shape, thus defining a rectangularly-shaped cross-section of the interior cavity, the interior cavity thus adapted to slide onto the rectangularly cross-sectional shaped housing.

17. An apparatus according to claim 12, wherein the male-ended square drive, socket, and screwdriver bit each extend from a revolver, the revolver pivotally mounted to the main body such that the revolver may be rotated.

* * * * *